(12) United States Patent
Weis

(10) Patent No.: US 11,889,622 B2
(45) Date of Patent: Jan. 30, 2024

(54) ELECTRONIC DEVICE WITH CONNECTED COMPONENT CARRIER AND FLUID COOLING MEMBER

(71) Applicant: AT&S Austria Technologie & Systemtechnik Aktiengesellschaft, Leoben (AT)

(72) Inventor: Gerald Weis, Bruck an der Mur (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 19 days.

(21) Appl. No.: 17/650,309

(22) Filed: Feb. 8, 2022

(65) Prior Publication Data

US 2022/0256692 A1 Aug. 11, 2022

(30) Foreign Application Priority Data

Feb. 9, 2021 (EP) ..................................... 21155986

(51) Int. Cl.
*H05K 1/02* (2006.01)
*H05K 3/36* (2006.01)
*H01R 12/52* (2011.01)
*H05K 1/18* (2006.01)

(52) U.S. Cl.
CPC ........... *H05K 1/0272* (2013.01); *H01R 12/52* (2013.01); *H05K 1/185* (2013.01); *H05K 3/368* (2013.01); *H05K 2201/064* (2013.01)

(58) Field of Classification Search
CPC .. H05K 1/0201; H05K 1/0203; H05K 1/0209; H05K 1/0272; H05K 3/368
See application file for complete search history.

(56) References Cited

U.S. PATENT DOCUMENTS

| | | |
|---|---|---|
| 5,373,627 A | 12/1994 | Grebe |
| 6,781,056 B1 | 8/2004 | O'Rourke et al. |
| 2009/0207568 A1 | 8/2009 | Haveri |
| 2011/0134610 A1 | 6/2011 | Bauer et al. |
| 2017/0167799 A1 | 6/2017 | de Sousa et al. |
| 2020/0273776 A1 | 8/2020 | Xu et al. |
| 2020/0312737 A1 | 10/2020 | Stahr et al. |

(Continued)

FOREIGN PATENT DOCUMENTS

| | | |
|---|---|---|
| DE | 202010017772 U1 | 12/2012 |
| DE | 102015012421 A1 | 3/2017 |
| DE | 102017210237 A1 | 12/2018 |

(Continued)

OTHER PUBLICATIONS

Zeisler, P.; Extended European Search Report in Application No. 21155986.9; dated Jul. 2, 2021; pp. 1-9; European Patent Office; 80298, Munich, Germany.

(Continued)

*Primary Examiner* — Jeremy C Norris
(74) *Attorney, Agent, or Firm* — Robert A. Blaha; Smith Tempel Blaha LLC

(57) ABSTRACT

An electronic device includes a component carrier having a stack with at least one electrically conductive layer structure and/or at least one electrically insulating layer structure, an electronic component on and/or in the stack, and a cooling member with a fluid cooling unit at least partially therein. The component carrier and the cooling member are connected by a connection structure.

20 Claims, 9 Drawing Sheets

(56) References Cited

U.S. PATENT DOCUMENTS

2022/0183147 A1* 6/2022 Reiter .................. H05K 1/0272
2023/0022285 A1* 1/2023 Terasaki ............... B23K 20/026

FOREIGN PATENT DOCUMENTS

| DE | 102020117063 A1 | 2/2021 |
| WO | 2016071324 A1 | 5/2016 |
| WO | 2019132955 A1 | 7/2019 |

OTHER PUBLICATIONS

Wits, W.; Integrated Cooling Concepts for Printed Circuit Boards; Dec. 4, 2008; pp. 1-161; University of Twente, Enchede, the Netherlands; ISBN 978-90-365-2731-6.

* cited by examiner

ELECTRONIC DEVICE WITH CONNECTED COMPONENT CARRIER AND FLUID COOLING MEMBER

CROSS-REFERENCE TO RELATED APPLICATIONS

The present application claims priority to European Patent Application No. 21155986.9 filed Feb. 9, 2021, the disclosure of which is incorporated herein by reference.

TECHNICAL FIELD

The disclosure relates to a method of manufacturing an electronic device, and relates to an electronic device.

TECHNOLOGICAL BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

Surface mounted and in particular embedded components may generate a considerable amount of heat during operation which may limit the performance and reliability of an electronic device. Hence, efficiently removing heat from an electronic component in an electronic device is an issue.

SUMMARY

There may be a need for an electronic device with proper electric reliability and efficient heat removal.

According to an exemplary embodiment of the invention, an electronic device is provided which comprises a component carrier comprising a stack with at least one electrically conductive layer structure and/or at least one electrically insulating layer structure, and comprising an electronic component on and/or in the stack, and a cooling member with a fluid cooling unit at least partially therein, wherein the component carrier and the cooling member are connected by a (for example metallic) connection structure (which, for example, contributes to a heat removal from the electronic component to the cooling unit).

According to another exemplary embodiment of the invention, a meth-od of manufacturing an electronic device is provided, wherein the method comprises mounting an electronic component on and/or in a stack of a component carrier, the stack comprising at least one electrically conductive layer structure and/or at least one electrically insulating layer structure, forming at least part of a fluid cooling unit in a cooling member, and connecting the component carrier and the cooling member by a (for example metallic) connection structure (which, for example, contributes to a heat removal from the electronic component to the fluid cooling unit).

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. A component carrier may comprise a laminated layer stack. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "electronic component" may particularly denote a component fulfilling an electronic task. For instance, such an electronic component may be a semiconductor chip comprising a semiconductor material, in particular as a primary or basic material. The semiconductor material may for instance be a type IV semiconductor such as silicon or germanium, or may be a type III-V semiconductor material such as gallium arsenide. In particular, the semiconductor component may be a semiconductor chip such as a naked die or a molded die. It is also possible that an electronic component is a passive device, such as an ohmic resistance, a capacitance or an inductance.

In the context of the present application, the term "cooling member" may particularly denote a second main constituent of the electronic device, in addition to the component carrier, which may be at least partially pre-fabricated separately from the component carrier before connection by the metallic connection structure. The cooling member may be configured for cooling the one more surface mounted and/or embedded electronic component(s) of the component carrier. The cooling member may functionally cooperate with the component carrier, in particular by a thermal coupling between cooling member and component carrier, and/or by the fact that an upper opening of the cooling member may be closed by the component carrier attached to the cooling member.

In the context of the present application, the term "fluid cooling unit in a cooling member" may particularly denote a constituent of the cooling member which may be configured so that a cooling fluid may be accommodated or may flow through the cooling member for cooling the electronic component. Such a flow may be from a source fluid interface member to a drain fluid interface member of the electronic device. Such a flow may also be a circular flow along a closed loop flow path of the electronic device. Furthermore, it is possible that cooling fluid remains permanently within the fluid cooling unit without flowing. When being located in an interior of the cooling unit (in particular while flowing through the integrated fluid cooling unit), the fluid may be heated by thermal energy emitted predominantly by the electronic component and also of the component carrier, which are thereby cooled. In particular, a cooling member with at least part of a fluid cooling unit therein may cover an embodiment in which the fluid cooling unit is integrated within the cooling member (as for instance in FIG. 9), and may also cover an embodiment in which a fluid cooling unit is formed in the cooling member and is closed by the component carrier (as for instance in FIG. 1).

In the context of the present application, the term "fluid" may particularly denote a liquid (such as water) and/or a gas (such as air), optionally comprising solid particles.

In the context of the present application, the term "metallic connection structure" may particularly denote a connection medium comprising metallic material and being arranged at mutually connected interfaces of the component carrier and the cooling member. Thereby, the metallic connection structure may establish both a mechanical and a thermal coupling between component carrier and cooling member, but preferably does not contribute to the conductance of electric current through the electronic device. For instance, the metallic connection structure may comprise a solder material (for instance comprising a consisting of tin), a sinter material (for example silver sinter paste), or an adhesive comprising metallic particles. A silver sinter medium or a diffusion bonding medium may be preferred. It may also be possible to establish the connection by thermal compression bonding or by a press fit.

According to an exemplary embodiment of the invention, an electronic device is provided which enables a highly efficient fluid-based cooling of an embedded and/or surface mounted electronic component, such as a power semiconductor chip. Two separately manufacturable constituents, i.e., a preferably flat component carrier (for instance a printed circuit board, PCB) and a cooling member with internal, integrated or recess-type fluidic structure(s) may be connected with each other preferably over their entire connection surfaces to thereby establish a proper mechanical and thermal coupling in between. Highly advantageously, at least part of said thermal and mechanical coupling may be established by a (for example metallic) connection structure (such as a solder material) in a simple, reliable and thermally efficient way. At the same time, such a (for example metallic) connection structure may preferably contribute to delimit a fluid chamber or conduit, since such a (for example metallic) connection structure may be liquid tight and highly thermally conductive.

In the following, further exemplary embodiments of the manufacturing method and the electronic device will be explained.

In an embodiment, the fluid cooling unit comprises a hollow space (for instance a cavity or at least one fluid guiding structure) for accommodating cooling fluid. In particular, the hollow space may be at least partially filled with cooling fluid. The fluid cooling may be a liquid cooling or a gas cooling. By a fluid cooling unit configured for liquid cooling, a cooling fluid or coolant accommodated in or flowing through a fluid channel or fluid chamber of the electronic device may be in the liquid phase, for example may be water. Further examples for fluids usable for cooling are glycol, water with additives like inhibitors (for instance phosphorus) to further prevent corrosion, or dielectric cooling fluids. By a fluid cooling unit configured for gas cooling, a coolant accommodated in or flowing through a fluid channel or fluid chamber of the electronic device may be in the gaseous phase, for instance may be air.

In an embodiment, the hollow space of the cooling member is delimited by an at least partially thermally conductive wall. At least part of the thermally conductive wall may have an inner surface profile configured for increasing a thermal exchange area between the cooling fluid and the at least partially thermally conductive wall. For instance, the inner surface profile may form part of the component carrier and/or may form part of the cooling member. The inner surface profile may in particular form part of one or two opposing main surfaces of the wall. For instance, the inner surface profile may be an oscillating or undulating structure (for instance a wave structure) increasing the active heat exchange surface. For example, the inner surface profile may be in accordance with a rectangular function, a saw tooth function, a sinusoidal function, etc. The wall may be delimited partially or entirely by a metallic material such as copper. Descriptively speaking, the inner surface profile may enhance thermal coupling between cooling fluid and wall and thus between cooling member and embedded component. For instance, structures forming the inner surface profile may have a height in a range from 5 μm to 500 μm. For example, a depth of structures forming the inner surface profile may be in a range from 5 μm to 500 μm. By taking the described measure, the surface in the channel may be thermally improved, since more surface brings better cooling performance. The surface portion which is profiled can be adjusted, for instance on one main side, on both main sides, or even fully circumferentially. For example, a semi-additive process (SAP) or a modified semi-additive process (mSAP), or a 3D printing process can be used to manufacture the topology. Alternatively, a differential etching process can also be carried out for this purpose.

In an embodiment, the metallic connection structure is a solder structure, a sinter structure, or an electrically conductive glue. In particular by soldering or sintering, metallic interfaces of the component carrier and of the cooling member may be mechanically reliably connected by the metallic connection structure, while simultaneously ensuring a highly thermally conductive path from electronic component to fluid cooling unit. Further-more, this may ensure a fluid tight (in particular gas tight or liquid tight) sealing of the hollow space for accommodating cooling fluid. In view of the latter properties, the metallic connection structure may also contribute to delimit a fluid chamber or fluid channel of the cooling unit. Alternatively, an electrically conductive glue may be used which may comprise metallic particles in an adhesive matrix.

In an embodiment, the metallic connection structure is an annular structure, i.e., an open or preferably closed ring. Advantageously, the metallic connection structure may connect component carrier and cooling member along a closed circumferential path (such as a line or a path of any other shape and/or style). This may ensure a low thermal resistance and a proper thermal coupling between component carrier and cooling member and may simultaneously create a closed fluid tight surrounding. Consequently, such a ring-shaped metallic connection structure may circumferentially delimit a fluid chamber or fluid channel of the fluid cooling unit.

In an embodiment, the cooling member comprises or consists of a further component carrier which comprises a further stack comprising at least one further electrically conductive layer structure and/or at least one further electrically insulating layer structure. Advantageously, the electronic device may be created by interconnecting two component carriers, in particular two printed circuit boards (PCBs), in form of the component carrier and the cooling member. This enables to use similar or the same materials (for example resin and copper, and optionally reinforcing glass structures and/or ceramic filler particles) for both component carriers so that improper material bridges may be avoided and CTE (coefficient of thermal expansion) mismatch at an interface between component carrier and cooling member may be suppressed. Furthermore, by simply connecting mutually facing connection surfaces of the component carriers, a flat and highly compact electronic device may be obtained.

In an embodiment, the fluid cooling unit is partially delimited by a cavity in the further stack. In the context of the present application, the term "cavity" may particularly denote a hole in the further component carrier, in particular a blind hole. A cavity may be delimited at least partially by a bottom portion of the further component carrier and may be delimited at least partially by one or more sidewalls of the further component carrier, in particular fully circumferentially. The cavity can be closed for completing formation of a cooling chamber by merely interconnecting the (in particular flat or recessed) component carrier with the metallic connection structure in between.

In an embodiment, the metallic connection structure and at least one of the at least one further electrically conductive layer structures partially delimit a cooling fluid accommodating cavity of the cooling unit. Advantageously, the above-mentioned cavity may be delimited at the bottom and at sidewalls by the at least one further electrically conductive layer structure, which may for instance be embodied as a continuous copper cladding. For instance, a continuous copper cladding can be formed by depositing copper at exposed walls of the cavity by electroless deposition or sputtering. When interconnecting such a further component carrier (having a metal cladded cavity, wherein the cladding may have a thickness of at least 1 μm or more) with the other component carrier (having the electronic component and having a metal layer at its bottom) and with the metallic connection structure in between, the entire cooling fluid accommodation chamber may be entirely delimited by metallic material. Thus, cooling liquid may be reliably prevented from being soaked by dielectric material (in particular resin) of the stacks of the component carriers. Highly advantageously, the cooling fluid accommodating cavity may be entirely delimited by metallic material of the component carrier, the further component carrier and the metallic connection structure.

In an embodiment, said metallic connection structure and said at least one of the at least one further electrically conductive layer structure (which may be in direct contact with each other) abut to at least one of the at least one further electrically insulating layer structure with a stepped interface. In particular, a stepped dielectric structure may be formed where the metallic connection structure and the further electrically conductive layer structure abut to the dielectric material of the further stack. Such a stepped geometry may improve the mechanical integrity of the electronic device at the inter-face between the component carriers.

In another embodiment, the cooling member comprises or consists of a metal body with at least one integrally formed fluid guiding structure, in particular at least one cooling channel. For instance, the fluid cooling unit may entirely consist of a metal, such as a machined copper plate. For example, such a metal plate or metal block may be provided with an interior hollow channel structure. However, the fluid guiding structures can also be realized in a dielectric structure which is covered by a metal layer. For instance, one more fluid guiding structures may be shaped as a meander, a spiral or a zig-zag structure, or are formed to create swirls or turbulence to further improve the thermal exchange with the component carrier. Such a cooling member can be manufactured in a simple way and has excellent thermal coupling properties. For instance, a thickness of such a metal body may be in a range from 0.5 mm to 3 mm, in particular from 1 mm to 2 mm.

In an embodiment, the connection structure comprises thermal inter-face material which contributes to a heat removal from the electronic component to the cooling unit. For example, the thermal interface material is thermally conductive and electronically non-conductive (for example a thermal prepreg). Advantageously, the connection structure may be an annular structure. In an embodiment, the connection structure may comprise metal and may form a metallic connection structure.

In an embodiment, fluid guiding structures can be applied on the inner surface of the cooling member (for instance having a cavity) and/or on the surface of a for instance PCB-type component carrier which may form a part of the cooling member.

In an embodiment, the metallic connection structure is connected to at least one of the at least one electrically conductive layer structure of the component carrier. Thus, an intermetallic connection between component carrier and metallic connection structure may be formed which provides a robust mechanical connection and a proper thermal coupling. Furthermore, this makes it possible that the mentioned electrically conductive layer structure of the component carrier contributes to the definition of the boundary of the fluid accommodation chamber. Preferably, a bottom surface of the component carrier may be equipped with a surface profile of structured copper to extend the surface area and therefore render heat transfer and cooling more efficiently.

In an embodiment, the metallic connection structure is electrically de-coupled from the electronic component by at least one of the at least one electrically insulating layer structure of the component carrier. Highly advantageously, electric signals propagating from and/or to the electronic component may be reliably prevented from an undesired interaction with a liquid coolant of the cooling member by a dielectric barrier. Such a dielectric barrier should be as thin as possible and should be thermally properly conductive. For instance, the dielectric barrier can be a single layer or multilayer structure (for instance made of any of the materials of the electrically insulating layer structures, as mentioned below). For example, a dielectric barrier may be made of two bonding sheets with a thermally highly conductive layer (for instance made of aluminum) in between. In other words, an electric flow path of the electronic device may be decoupled from a fluid flow path, whereas a thermal coupling between the component carrier and the cooling member may be enabled.

In an embodiment, the metallic connection structure partially delimits a cooling fluid accommodating cavity of the fluid cooling unit. Advantageously, the metallic connection structure fulfills several functions at the same time, i.e., establishes a mechanical connection between component carrier and cooling member, ensures a thermal coupling between component carrier and cooling member, and forms part of a fluid tight and non-soaking boundary of a coolant fluid chamber.

In an embodiment, the metallic connection structure has a slanted surface portion which partially delimits a cooling fluid accommodating cavity of the cooling unit. For example, such a slanted surface portion may be created by solder or sinter material flowing slightly into a fluid accommodating chamber or channel when connecting component carrier and cooling member with the metallic connection structure in between. For instance, such a flow may be promoted by the tendency of increasing a wetting surface, by capillary effects, or the like. Descriptively speaking, such a material flow resulting in a slanted geometry may remove sharp corner regions which may otherwise be thermally poorly connected. Furthermore, the thermally highly conductive material of the metallic connection structure accumulates highly thermally conductive material close to the fluid accommodation chamber and thereby increases the cooling performance and the cooling power in view of the increased metallic volume delimiting the fluid accommodation chamber.

In an embodiment, at least one of said at least one electrically insulating layer structure has a thermal conductivity of at least 1.4 W/mK, in particular of at least 2.5 W/mK, and preferably of at least 4.5 W/mK, for instance is a thermal prepreg. Even more preferably, said thermal conductivity may be even at least 9.5 W/mK (for instance when aluminum oxide is used). In contrast to this, one or more other electrically insulating layer structures of the component carrier and/or of the cooling member may for instance be made of ordinary prepreg and may have, for example, a thermal conductivity of 0.4 W/mK to 1.2 W/mK. Said thermally conductive coupling structure embodied as a thermal prepreg may have the mentioned high values of the thermal conductivity. Consequently, such a thermal prepreg may provide a pronounced contribution to the heat transfer between component carrier and cooling member. Advantageously, the thermal prepreg may fulfil the following double function: On the one hand, the thermal prepreg may contribute to a strong thermal coupling between component carrier and cooling member. On the other hand, the thermal prepreg may electrically decouple the component carrier (with the embedded or surface mounted electronic component) from the cooling member (accommodating cooling fluid).

In an embodiment, one (preferably only one) electrically insulating layer structure of the electrically insulating layer structures which is located closest to the metallic connection structure has a higher value of the thermal conductivity than all other electrically insulating layer structures of the component carrier. Thus, the mentioned electrically insulating layer structure closest to the metallic connection structure may for instance be a thermal prepreg and may highly advantageously promote the heat transfer from the component carrier to the cooling member while simultaneously electrically decoupling the component carrier from the cooling member. For all other electrically insulating layer structures, a particularly high thermal conductivity may be of lower relevance, so that the other electrically insulating layer structure(s) may be made of ordinary prepreg and hence may be provided with low cost.

In a preferred embodiment, a fluid guiding structure of the cooling member is fully circumferentially delimited by electrically conductive material. This may be preferred for both above-described embodiments, in which the cooling member is a component carrier with cavity or recess(es), or is a machined metal body with hollow interior fluid guiding structure(s). For example, the fully circumferential metallization may be accomplished by manufacturing the cooling member from a fully metallic body with one or more interior volumes forming one or more fluid guiding structures or cavities. Alternatively, this may be achieved for example by delimiting a fluid guiding structure or cavity by a copper cladding lining of a recess of the component carrier together with the metallic connection structure and a bottom-sided metal structure (in particular copper layer) of the component carrier.

In an embodiment, the electronic device comprises at least one fluid interface member configured for being fluidically connected to a fluid conduit in the component carrier and/or in the cooling member for supplying cooling fluid to the fluid cooling unit (in particular a fluid accommodating cavity or fluid channel) and/or for draining cooling fluid from the fluid cooling unit. For instance, the at least one fluid interface member is configured for forming a screw connection with a counterpart, for example an exterior tubing for supplying or draining cooling fluid. Alternatively, the fluid interface member may be a fitting part to be connected with a cooperating other fitting part at the end of a supply tube or the like. By equipping the electronic device with such fluid interface members, a continuous flow of cooling fluid supplied at one fluid interface member, flowing through the cooling member, and drained at another fluid interface member may be realized.

In an embodiment, the at least one fluid interface member is formed at an exterior surface of the component carrier and/or is formed at an exterior surface of the cooling member. For this purpose, an access hole may be formed at an exterior surface of the component carrier or of the cooling member and may be brought in fluid communication with the fluid accommodation chamber in an interior of the cooling member.

In an embodiment, the at least one fluid interface member is formed at a main surface of the electronic device or is formed at a sidewall of the electronic device. Hence, any available surface portion of the preferably plate-shaped component carrier or the cooling member may be used for fluidically connecting said fluid interface member.

In a preferred embodiment, the plate-shaped component carrier may have a surface topology or profile at its bottom side for increasing a heat exchange area of the cooling unit which may be closed at its top side by the component carrier. For instance, this may be accomplished by etching copper structures at a bottom side of the component carrier. For example, structures forming the surface profile may have a height in a range from 5 μm to 500 μm. For example, a depth of structures forming the surface profile may be in a range from 5 μm to 500 μm.

In an embodiment, the stack is a laminated layer stack. Lamination made denote the process of connecting the layer structures of the stack by mechanical pressure and/or by heat. An electronic component may also be embedded in the stack by lamination.

In an embodiment, the manufacturing method comprises forming the fluid cooling unit as a cavity in a further component carrier (constituting the cooling member) which comprises a further stack comprising at least one further electrically conductive layer structure and/or at least one further electrically insulating layer structure. Said cavity may be formed by embed-ding a poorly adhesive structure (such as polytetrafluoroethylene (PTFE) or a waxy material) as a release layer in the further stack and circumferentially cutting out a piece of the stack which is delimited at a bottom side by the poorly adhesive structure. Hence, the electronic device including its cavity may be manufactured purely by component carrier technology, in particular by printed circuit board technology.

In another embodiment, the manufacturing method comprises forming the fluid cooling unit as at least one fluid guiding structure integrally formed in a metal body. Thereafter, metal material of the metal body may then be removed after connection with the component carrier to thereby establish a fluid communication from an exterior of the electronic device through the component carrier up to the at least one fluid guiding structure. Descriptive-ly speaking, the material removal may expose or open the fluid guiding structure to enable a fluidic access to the fluid guiding structure from an exterior side. Formation of the cooling member by simply forming an access hole in a perforated metal block is simple and provides a high thermal performance. The connection of such a purely metallic cooling member with a component carrier manufactured in PCB-technology is simple and straight-forward and may be accomplished by simply soldering or sintering the metallic connection structure.

In an embodiment, a cavity for forming a fluid accommodating volume of the cooling member or for embedding an electronic component in the component carrier may be formed for example by embedding a poorly adhesive sheet in a layer stack of the respective component carrier. Thereafter, a piece of the stack above the poorly adhesive sheet may be circumferentially separated, for instance by laser drilling or laser routing, from the rest of the stack. Due to the poor adhesion between stack material and poorly adhesive sheet, the separated piece(s) of the stack may thereafter be taken out from the stack, so that the cavity or cavities is or are completed.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g. based on polyphenylenether, PPE), polyimide (PI), polyamide (PA), liquid crystal polymer (LCP), polytetrafluoroethylene (PTFE) and/or a combination thereof. Rein-forcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al2O3$) or aluminum nitride (AlN). In order to increase the heat ex-change capacity, other geometries with increased surface area are frequent-ly used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semi-conductor materials such as silicon carbide (SiC), gallium arsenide (GaAs), gallium nitride (GaN), gallium oxide ($Ga2O3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the disclosure are apparent from the examples of embodiment to be described hereinafter and are explained with reference to these examples of embodiment.

DETAILED DESCRIPTION OF ILLUSTRATED EMBODIMENTS

Figure 1:
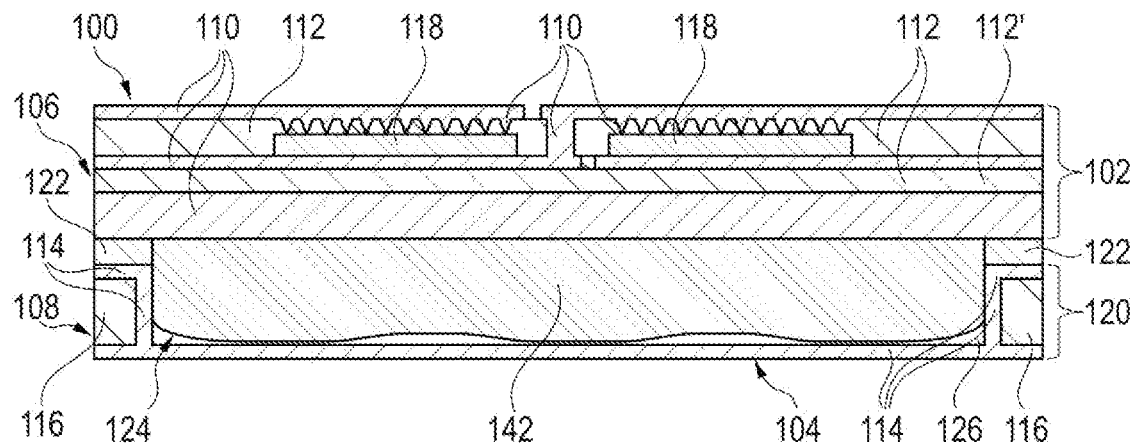
FIG. 1 illustrates a cross-sectional view of an electronic device according to an exemplary embodiment of the invention.

The illustrations in the drawings are schematically presented. In different drawings, similar or identical elements are provided with the same reference signs.

Before, referring to the drawings, exemplary embodiments will be de-scribed in further detail, some basic considerations will be summarized based on which exemplary embodiments of the invention have been developed.

According to an exemplary embodiment of the invention, an electronic device is provided which is composed of two interconnected constituents, i.e., a component carrier (such as a PCB) with embedded electronic component(s) (for instance a transistor chip) and a cooling member (which may be a further PCB or a pre-fabricated metallic body) with integrated fluid (preferably liquid) cooling unit. Advantageously, a metallic connection structure may mechanically and thermally couple component carrier and cooling member, and may highly advantageously also contribute to the spatial definition (i.e., may form part of a boundary) of a cooling chamber or a fluid guiding structure comprising a fluidic (in particular liquid) coolant. Hence, the metallic connection structure may fulfill a plurality of functions simultaneously. Descriptively speaking, an exemplary embodiment may provide an electronic device with a PCB-based water fluid guiding structure.

During operation of such an electronic device, an embedded or a surface mounted component (such as a power semiconductor transistor chip) may become hot. Such one or more electronic components on and/or in a component carrier may be thermally coupled—preferably via an electrically insulating and thermally conductive structure—with a metallic structure (preferably comprising copper) having an even better thermal conductivity, being liquid resistant and delimiting a fluid accommodation volume. The latter metallic structure may form part of a cooling member, such as a PCB-integrated water-cooling member or a machined metal body. Hence, while the first constituent of the electronic device which comprises the at least one electronic component (as heat source) is a component carrier such as a PCB, the second constituent in form of the cooling member may be fabricated in PCB-technology as well or may be produced as a perforated metal body.

When being embodied as further component carrier, a cavity may be formed in the cooling member and may be filled with a cooling fluid during operation of the electronic device. For instance, the cavity may be formed by embedding a poorly adhesive structure in a stack of the further component carrier, and a piece of the stack above the poorly adhesive structure may be removed by circumferentially cutting the stack up to a depth corresponding to the poorly adhesive structure. Such an embodiment has the advantage that the entire electronic device can be manufactured in PCB technology.

When being embodied as a processed metal body comprising interior hollow spaces functioning as fluid channels, the cooling member can for instance be formed on the basis of a copper plate with preformed fluid channels. Such a processed metal plate may then be connected to the component carrier by a metallic connection structure. Optionally but preferably, an opening may be formed in the electronic device which extends through the component carrier and into a wall of the metal body up to at least one of the fluid channels in the metal body for establishing a fluid connection between an exterior of the electronic component and the fluid channel.

Exemplary embodiments of the invention are based on a paradigm shift what concerns the cooling of electronic components. In power electronics, a PCB with embedded power chip is conventionally attached to a heat sink. However, this may create undesired thermal interfaces resulting in high thermal resistances. In order to overcome such conventional shortcomings, an exemplary embodiment of the invention uses free space inside a PCB for cooling purpose. As a result, no external heat sink is any longer required for power electronics. In contrast to this, a free space inside of a PCB may be used for cooling with very low thermal resistance. Moreover, a volume of the electronic device with cooling function may be reduced due to an integrated cooling unit. A manufacturing architecture of exemplary embodiments of the invention is completely flexible and based on simple processes. Electrically optimized connections are supported by such a manufacturing architecture. In particular, a cooling path can be applied where it is needed. An electronic device according to an exemplary embodiment of the invention may be in particular highly appropriate for high power applications or high current applications. In view of the integrated provision of a cooling unit in an interior of the electronic device, a compact configuration may be achieved. A combination between the described cooling member and one or more embedded components enables the provision of high-performance PCBs. Particularly advantageous is a combination of embedded components and water fluid guiding structures in a pure PCB structure. Moreover, an electronic device according to an exemplary embodiment of the invention may be manufactured with low effort. The reliability of the electronic device may be significantly improved by creating a sealed channel, which may be partially delimited by a metallic connection structure. In particular, a combination of embedded components and water fluid guiding structures/elements in a single PCB body may be highly advantageous.

In power electronics, in particular transistors may generate losses during operation because of non-ideal devices. These losses may generate heat that should be removed in an efficient way to ensure proper operation of an electronic device.

Conventionally, it is possible to mount such transistors on the outside of a printed circuit board or as an embedded component inside the printed circuit board and cool the device by an external heat sink. A thermal interface material may then ensure proper heat distribution and may also ensure electrical isolation at the same time. In case of more losses, water cooling may be installed connected to the metallic (for instance aluminum) heat sink.

In order to overcome at least partially the above-mentioned conventional and/or other shortcomings, an exemplary embodiment of the invention provides an electronic device with a functionality to cool one more embedded electronic components (such as transistor chips) by implementing a cooling unit (for instance a water channel) into a PCB itself. This enables a low height of the electronic device and thus a compact configuration and miniaturization in vertical direction. Furthermore, this may allow for a more efficient cooling due to small distances and therefore smaller thermal barriers to the embedded electronic component(s) (such as power chips) and less thermal interfaces.

In particular the above-described concept of forming a cavity in a component carrier using a poorly adhesive structure or release layer for defining a bottom of said cavity is highly appropriate to form a copper cladded channel. A copper foil or a PCB core may function as cover for closing the channel. Such a channel can be of any desired shape with limited height (depending on core material). Water may be injected through a copper cladded hole into the channel. In this hole, a connector for a flexible tube may be soldered to ensure proper connection for the liquid. While PCB dielectrics such as FR4 material may be soaked by water or other liquids, such phenomena may be avoided by a continuous copper cladding of the channel itself. In other words, metal (in particular copper) cladding of the fluid guiding structure or chamber may ensure that the coolant remains in the fluid guiding structure or chamber, and that PCB dielectrics remain spaced with respect to the fluidic (in particular liquid) coolant. As a result, the provided electronic device may have a high reliability, in particular the electric reliability. Excellent cooling performance may be synergistically combined with a compact design of the electronic device with embedded power component(s).

The mentioned fluid guiding structure may be formed for example by milling or laser cutting. A minimum cross-section of the fluid guiding structure may help to balance the pressure against the throughput. Calculations and simulations may contribute to ensure optimized operation conditions.

FIG. 1 illustrates a cross-sectional view of an electronic device 100 according to an exemplary embodiment of the invention.

The plate-shaped electronic device 100 according to FIG. 1 is composed of two main constituents, i.e., a component carrier 102 and a cooling member 120.

The plate-shaped laminate-type component carrier 102 is here embodied as a printed circuit board (PCB). The component carrier 102 comprises a laminated layer stack 106 formed of one or more electrically conductive layer structures 110 and one or more electrically insulating layer structures 112. For example, the electrically conductive layer structures 110 may comprise patterned or continuous copper foils and vertical through-connections, for example copper filled laser vias which may be created by plating. The electrically insulating layer structures 112 may comprise a respective resin (such as a respective epoxy resin), preferably comprising reinforcing particles therein (for instance glass fibers or glass spheres). For instance, the electrically insulating layer structures 112 may be made of prepreg or FR4. A lowermost of the electrically insulating layer structures 112 may be a thermally highly conductive electrically insulating layer structure 112' (for instance a thermal prepreg or a ceramic plate, for instance made of aluminum nitride) having a higher thermal conductivity (for example at least 1.4 W/mK) than the other electrically insulating layer structures 112 (for example having a thermal conductivity of not more than 1.2 W/mK).

Furthermore, the component carrier 102 has (in the shown embodiment two) electronic components 118 which are embedded in the stack 106. For example, the electronic components 118 are power semiconductor chips such as transistor chips. The electronic components 118 may be electrically coupled with an exterior periphery of the electronic device 100 and/or with each other by the electrically conductive layer structures 110. During operation of the electronic device 100, the electronic components 118 may generate a considerable amount of heat which needs to be removed out of the electronic device 100 in order to obtain a high performance.

In order to efficiently promote heat removal, the electronic device 100 comprises, as a second main constituent, a cooling member 120 with integrated fluid cooling unit 124 which is here embodied as a fully circumferentially metal cladded cavity 126. Thus, the fluid cooling unit 124 comprises an interior hollow space in form of the cavity 126. Apart from one or more access holes connecting the cavity 126 fluidically with fluid interface members 138 or the like (not shown in FIG. 1, compare for instance FIG. 9), the cavity 126 may be hermetically sealed. The fluid cooling (preferably a liquid cooling) may be accomplished by cooling fluid 142 (for example water) in the cavity 126. Heat generated by the electronic components 118 during operation of the electronic device 100 may be thermally conducted into the cooling member 120 and may be carried away by the cooling fluid 142, which is thereby heated.

In the shown embodiment, the cooling member 120 with its fluid cooling unit 124 is a further component carrier 104, in particular a further plate-shaped laminate-type component carrier such as a further printed circuit board (PCB). Thus, the cooling member 120 comprises a further laminated layer stack 108 comprising one or more further electrically conductive layer structures 114 and one or more further electrically insulating layer structures 116.

Optionally, at least one component (such as an electronic component 118 described above for the component carrier 102) can be embedded in the cooling member 120 (not shown). As the cooling member 120 may be a PCB with cavity, there can be at least one component embedded in or surface mounted on cooling member 120. For instance, such a component may be used to route signals.

For example, the further electrically conductive layer structures 114 may comprise patterned or continuous copper foils and optionally vertical through-connections, for example copper filled laser vias which may be created by plating. The further electrically insulating layer structures 116 may comprise a respective resin (such as a respective epoxy resin), preferably comprising reinforcing particles therein (for instance glass fibers or glass spheres). For instance, the further electrically insulating layer structures 116 may be made of prepreg or FR4.

As shown in FIG. 1, the (for instance separately preformed) component carrier 102 and cooling member 120 are connected by a highly thermally conductive metallic connection structure 122 which may be applied for example by dispensing. Thanks to its high thermal conductivity, the metallic connection structure 122 contributes to a heat transfer from the electronic component 118 to the cooling unit 124. Preferably, the highly thermally conductive metallic connection structure 122 has a thermal conductivity of at least 50 W/mK, in particular of at least 100 W/mK. Advantageously, the metallic connection structure 122 may be a solder structure or a sinter structure (such as a cured sinter paste) so that the component carrier 102 and the cooling member 120 may be thermally and mechanically connected preferably by soldering or sintering. Although not shown in the cross-sectional view of FIG. 1, the metallic connection structure 122 may be a circumferentially closed annular structure extending along the entire perimeter of the electronic device 100. The metallic connection structure 122 is in direct physical contact with metallic material of the component carrier 102 and with metallic material of the cooling member 120.

As shown, the fluid accommodation volume of the fluid cooling unit 124 is defined by the cavity 126 in the further stack 108. A bottom surface as well as sidewalls delimiting the cavity 126 are made of metallic material, in particular are cladded with copper. An upper surface of the fluid accommodation volume closing the cavity 126 at an upper side is formed by the lowermost electrically conductive layer structure 110 of the component carrier 102, which is a thick copper sheet. The metallic connection structure 122 closes sidewalls of the cavity 126 at an upper side and also contributes to the fully circumferentially metal cladding delimiting the fluid accommodation volume of the cooling unit 124. In other words, the metallic connection structure 122, electrically conductive layer structures 110 of the component carrier 102 and further electrically conductive layer structures 114 of the component carrier-type cooling member 120 completely delimit the cooling fluid accommodating cavity 126 of the cooling unit 124. In other words, no dielectric material of the component carrier 102 and of the cooling member 120 gets in direct physical contact with cooling fluid 142, for example water. Hence, soaking of dielectric resin by cooling fluid 142 may be reliably prevented, since the cooling fluid 142 is only in direct physical contact with metallic material inside of the electronic device 100. The metallic connection structure 122 is connected to the lowermost electrically conductive layer structure 110 of the component carrier 102 and to a further electrically conductive layer structure 114 of the cooling member 120. This ensures a fluid tight surrounding of the cooling fluid 142 by metallic materials only. Optionally, the continuous metallic walls defining the cavity 126 may be covered by a passivating film (not shown). Furthermore, a copper topology (not shown in FIG. 1, see for instance FIG. 28 and FIG. 29) may be formed at the backside of the component carrier 102.

Further advantageously, the metallic connection structure 122 is electrically decoupled from the electronic components 118 by the lowermost highly thermally conductive electrically insulating layer structure 112' of the component carrier 102 forming a barrier for electricity. Thus, an undesired electric connection between the electric path connected to the electronic components 118 on the one hand and the fluidic path of cooling member 120 is reliably prevented. At the same time, component carrier 102 and cooling member 120 are strongly thermally coupled thanks to the lowermost highly thermally conductive electrically insulating layer structure 112' of the component carrier 102 which may be made of thermal prepreg.

During operation of the electronic device 100, an electric signal may be applied to the electronic components 118 by the electrically conductive layer structures 110 so that the electronic components 118 may fulfill their electronic functionality (for instance a power semiconductor functionality). Heat generated during operation of the electronic components 118 may be conducted in a downward direction through highly thermally conductive metallic structures (see reference signs 110, 122, 114) and through highly thermally conductive and electrically insulating layer structure 112'. The heat may be absorbed by the cooling fluid 142 which may continuously flow (for instance may be pumped) through the cavity 126. Alternatively, the cooling fluid 142 may remain permanently within cavity 126. Thus, heat may be efficiently removed out of the electronic device 100 which increases the performance of the electronic device 100. At the same time, electric reliability of the electronic device 100 can be ensured by reliably avoiding short-circuiting of electric signals by cooling fluid 142 (see in particular reference sign 112'). In view of the flat design of the electronic device 100, which is basically constituted by two stacked PCBs, a highly compact configuration is obtained which has very small space consumption in the vertical direction. Further advantageously, the described configuration keeps the thermal paths inside of the electronic device 100 short, which keeps losses small and guarantees a high heat removal capability.

Figure 2:
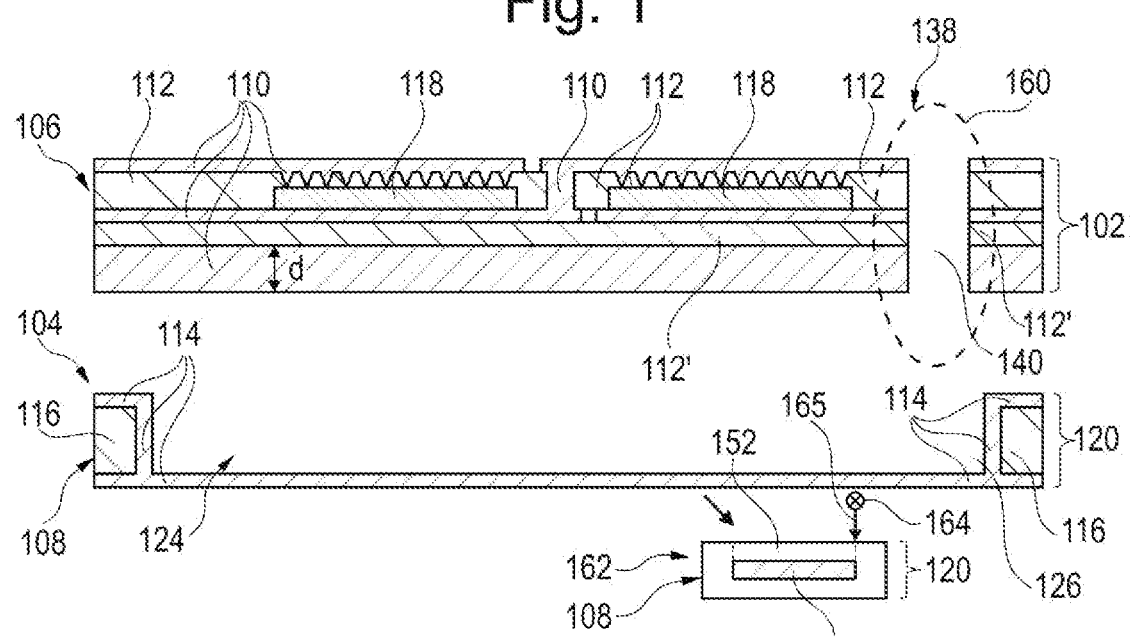
FIG. 2 and FIG. 3 illustrate cross-sectional views of structures obtained during carrying out a method of manufacturing an electronic device according to FIG. 1.
Figure 3:
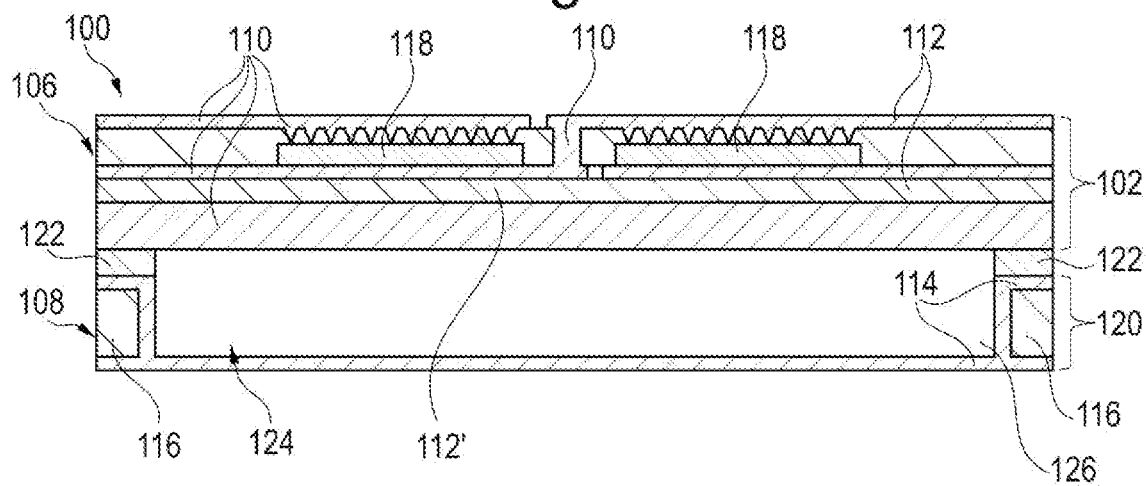

FIG. 2 and FIG. 3 illustrate cross-sectional views of structures obtained during carrying out a method of manufacturing an electronic device 100 according to FIG. 1.

FIG. 2 shows the two main constituents of the electronic device 100, i.e., component carrier 102 and cooling member 120, still separated from each other.

What concerns the component carrier 102, it is shown that the two electronic components 118 are already embedded in laminated layer stack 106. Moreover, FIG. 2 illustrates with reference sign 160 a through hole or fluid conduit 140 which has been formed to extend vertically through the entire stack 106 for forming a fluid interface member 138 (compare FIG. 4 to FIG. 8) enabling an external access to the cooling unit 124 of the cooling member 120. For example, said through hole may be created by mechanically drilling or laser drilling.

Again, referring to FIG. 2, the thickest one of the electrically conductive layer structures 110 is located at the bottom of layer stack 106 and may have a thickness, d, of for instance at least 50 µm, in particular at least 500 µm (for instance to accomplish proper heat spreading). This allows to establish a proper thermal coupling between component carrier 102 and cooling member 120 while also contributing to a hollow fluid accommodation volume within the electronic device 100 after connection of component carrier 102 with cooling member 120. Said thickest and lowermost electrically conductive layer structure 110 also delimits part of said hollow fluid accommodation volume which is, together with the cooling member 120, completely delimited by electrically conductive material. Thus, soaking of liquid in dielectric stack material may be reliably prevented.

Directly above the thickest one of the electrically conductive layer structures 110 located at the bottom of layer stack 106, a continuous layer in form of electrically insulating layer structure 112' configured as thermal prepreg is arranged (this arrangement can also be vice versa). Among all electrically insulating layer structures 112 of stack 106, lowermost electrically insulating layer structure 112' has the highest thermal conductivity. Thus, lowermost electrically insulating layer structure 112' fulfils two functions: Firstly, lowermost electrically insulating layer structure 112' strongly promotes an efficient thermal coupling between component carrier 102 and cooling member 120. Secondly, lowermost electrically insulating layer structure 112' electrically decouples the electric circuitry including the embedded electronic components 118 above lowermost electrically insulating layer structure 112' from the fluidic system below lowermost electrically insulating layer structure 112'. This avoids short-circuiting of flowing current and increases the electric reliability of the electronic device 100.

What concerns the cooling member 112, reference sign 162 of FIG. 2 schematically illustrates formation of cavity 126 of fluid cooling unit 124 in cooling member 120. As shown, a poorly adhesive structure 150 may be embedded in the stack 108 of the cooling member 120. The poorly adhesive structure 150 may be made of a material (such as polytetrafluoroethylene (PTFE) or a waxy material) which does not properly adhere to the surrounding material of the stack 108. The poorly adhesive structure 150 may also be denoted as a release layer because it defines an area inside of the stack 108 at which different portions of the stack 108 may be separated or released. Still referring to FIG. 2, a laser beam 165 created by a laser source 164 (or a mechanical drill bit, not shown) may be used for carrying out a circumferential cut from an exterior of the stack 108 extending up to the poorly adhesive structure 150. The above-mentioned circumferential cut may isolate a piece 152 from the rest of the stack 108. The piece 152 is laterally delimited by a circumferential cutting line, and is delimited at a bottom side by the poorly adhesive structure 150. Consequently, the piece 152 may be removed from the rest of the stack 108. Hence, cavity 126 is formed by embedding the poorly adhesive structure 150 in the stack 108 and by circumferentially cutting out and taking out piece 152 of the stack 108, said piece 152 being delimited at a bottom side by the poorly adhesive structure 150.

As shown, cooling member 120 is configured as further component carrier 104 which comprises further laminated layer stack 108 in which the cavity 126 is formed, as described. As shown in FIG. 2 as well, the entire cavity 126 is delimited by electrically conductive material in the form of electrically conductive layer structures 114. It is possible that, after forming cavity 126 as illustrated by reference sign 162, electrically conductive material may be deposited in the cavity 126 for continuously coating or cladding the cavity 120 entirely with electrically conductive material such as copper.

Now referring to FIG. 3, the component carrier 102 and the cooling member 120 as processed according to FIG. 2 may be interconnected by annular metallic connection structure 122 which may be embodied as solder. As shown, material of the metallic connection structure 122 contributes to delimiting the fluid accommodation volume of the electronic device 100 in which cooling fluid 142 is accommodated as coolant. Metallic connection structure 122 is connected with metallic material of both the component carrier 102 and the cooling member 120 and thereby promotes an efficient heat removal from the electronic component 118 to the cooling unit 124 thanks to the high thermal conductivity of the metallic connection structure 122.

FIG. 4 to FIG. 8 illustrate cross-sectional views of details of structures obtained during carrying out a method of manufacturing an electronic device 100 according to an exemplary embodiment of the invention. More specifically, FIG. 4 to FIG. 8 show how a fluidic connection between an exterior of the electronic device 100 and the fluid accommodating cavity 126 in the cooling member 120 can be formed.

Figure 4:
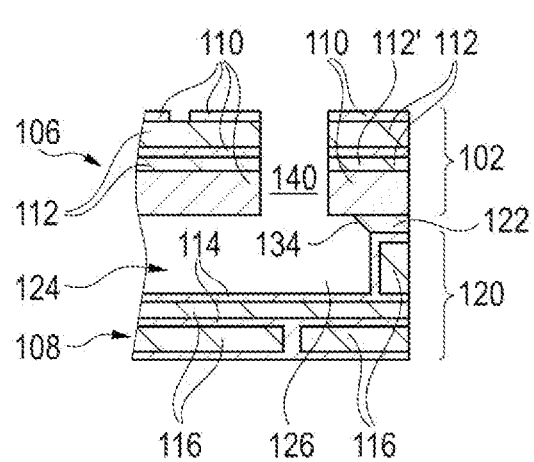
FIG. 4, FIG. 5, FIG. 6, FIG. 7 and FIG. 8 illustrate cross-sectional views of details of structures obtained during carrying out a method of manufacturing an electronic device according to an exemplary embodiment of the invention.

Referring to FIG. 4, a through hole is drilled as fluid conduit 140 through the stack 106 so as to obtain an external access to the cavity 126. Formation of the through hole may be done for example by mechanically drilling or laser drilling.

As shown as well in FIG. 4, the metallic connection structure 122 may be formed with a slanted surface portion 134 which partially delimits the cooling fluid accommodating cavity 126 of the cooling unit 124. During soldering (optionally accompanied by pressing together component carrier 102 and cooling member 120), solder, sinter or adhesive material of the metallic connection structure 122 may flow into the cavity 126 and may thereby form slanted surface portion 134. The illustrated advantageous shape of the slanted surface portion 134 may be obtained by adjusting the characteristics of the solder or sinter connection for creating the metallic connection structure 122. In particular, adjusting viscosity of a paste (which may for instance be applied by dispensing) used for forming the metallic connection structure 122, an applied mechanical pressure, a processing temperature, etc., may allow to adjust the shape of the slanted surface portion 134. Viscosity of a paste used for creating metallic connection structure 122 may also be adjusted to fill vias in the component carrier 102 and/or the cooling member 120 for further improving the mechanical integrity of the electronic device 100. Thus, highly thermally conductive solder material may delimit a significant surface area of cavity 126 and provides an additional volume of high thermal conductivity for further enhancing the heat transfer and cooling effect.

Figure 5:
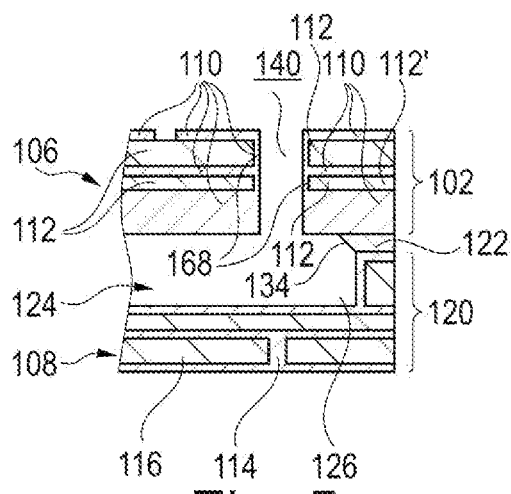

Referring to FIG. 5, sidewalls of the fluid conduit 140 may then be coated with electrically conductive material 168 such as copper. For example, this may be accomplished by electroless plating. As a result, the entire fluid conduit 140 is delimited by electrically conductive material 168 rather than by dielectric material of the electrically insulating layer structures 112, 112'. This may advantageously suppress undesired soaking of a dielectric wall portion with cooling fluid 142 supplied via fluid conduit 140 into cavity 126. Such a soaking may occur when cooling fluid 142 comes into direct physical contact with resin material of the electrically insulating layer structures 112, 112'.

Figure 6:
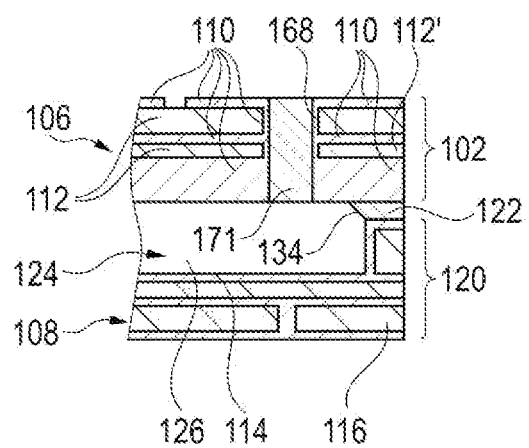

In order to obtain the structure shown in FIG. 6, auxiliary material 171 may be inserted into the fluid conduit 140, for instance by stencil printing. Said auxiliary material 171 can be a via plugging paste (for instance a material similar to FR4) to keep the channels dry during production, so that no chemical residues can stay in the water channel after manufacturing.

Figure 7:
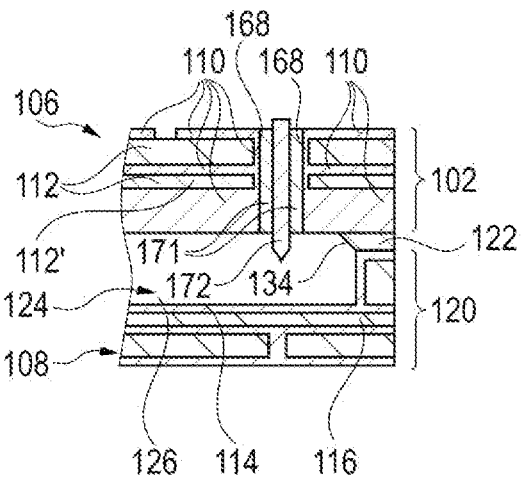

Referring to FIG. 7, a drill or pin 172 is guided through the auxiliary material 171 in the fluid conduit 140 for creating an opening extending vertically through the auxiliary material 171 into the cavity 126.

Figure 8:
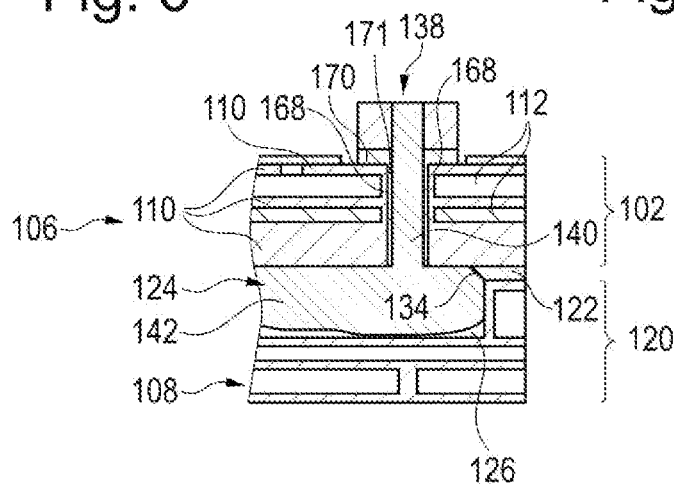

Referring to FIG. 8, fluid interface member 138, which may be a fitting or fitting part, is connected by soldering with the component carrier 102 using solder material 170. For instance, fluid interface member 138 may be configured as fitting configured for establishing a screw connection with a counter screw at the end of a tube or capillary (not shown). As a result, the electronic device 100 is provided with the fluid interface member 138 connected to fluid conduit 140 for supplying cooling fluid 142 to the cavity 126 or for draining cooling fluid 142 from the cavity 126. As shown, the fluid interface member 138 is connected to an exterior main surface of the component carrier 102. The fluid interface member 138 is fluidically coupled through the component carrier 102 into the cavity 126 of the cooling member 120. Although not shown, it is also possible that fluid interface member 138 is formed at an exterior surface of the cooling member 120. While the fluid interface member 138 is formed at an upper main surface the component carrier 102 according to FIG. 8, it is alternatively possible that the fluid interface member 138 is formed at a sidewall of the component carrier 102 or of the cooling member 120.

As a result of the process described referring to FIG. 4 to FIG. 8, a cooling pipe connection is established. The heat removal chamber in form of cavity 126 may be filled with a cooling fluid 142 such as water and may act similar as a heat pipe.

Figure 9:
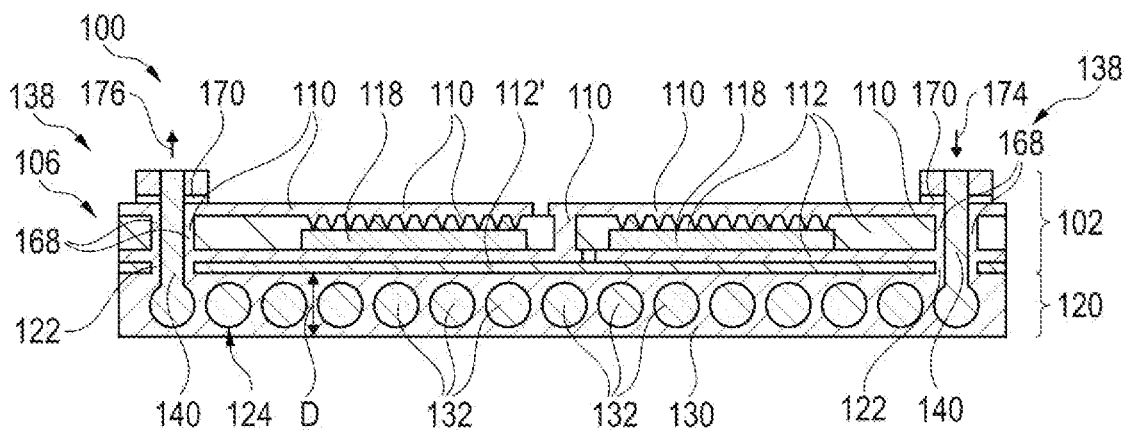
FIG. 9 illustrates a cross-sectional view of an electronic device according to another exemplary embodiment of the invention.

FIG. 9 illustrates a cross-sectional view of an electronic device 100 according to another exemplary embodiment of the invention.

A difference between the embodiment of FIG. 9 and the embodiment of FIG. 1 is that, according to the embodiment of FIG. 9, the cooling member 120 is embodied as a machined metal sheet rather than being configured as PCB. More specifically, the cooling member 120 according to FIG. 9 is realized as a metal body 130 with integrally formed interior fluid guiding structures 132. Thus, the fluid cooling unit 124 comprises a hollow space in form of the (for instance separate or interconnected) fluid guiding structures 132. Each of the fluid guiding structures 132 of the cooling member 120 is fully circumferentially delimited by electrically conductive material of the metal body 130. In particular, the metal body 130 with integral fluid guiding structures 132 may be a copper block having a thickness, D, in a range from 0.5 mm to 10 mm, for example 1 mm. Cooling traces may be formed inside of the metal body 130 as hollow fluid guiding structures 132. For example, the fluid guiding structures 132 may be arranged in a meander, spiral or zig-zag configuration. There can also be areas with high density channel configurations and areas with low density. Such designs may promote a proper heat transfer from the metal body 132 to the cooling fluid 142 flowing through the fluid guiding structures 132.

The connection between the component carrier 102 and the cooling member 120 may be established by a metallic connection structure 122 as well, for example by soldering, sintering, by an electrically conductive adhesive, or by thermal compression bonding. This can also be integrated into the manufacturing cycle of the PCB (in particular lamination).

Moreover, FIG. 9 shows two fluid interface members 138 at an upper main surface of the component carrier 102 and being in fluid communication with the fluid guiding structures 132. As shown by an arrow 174, one fluid interface member 138 is configured for supplying cooling fluid 142 (such as water) to the fluid guiding structures 132. As shown by an arrow 176, the other fluid interface member 138 is configured for draining the cooling fluid 142 from the fluid guiding structures 132 to a drain (not shown).

FIG. 10 to FIG. 14 illustrate cross-sectional views of details of structures obtained during carrying out a method of manufacturing an electronic device 100 of the type as shown in FIG. 9 according to an exemplary embodiment of the invention. More specifically, FIG. 10 to FIG. 14 show how the fluid cooling unit 124 according to FIG. 9 can be fluidically connected from an exterior side of the electronic device 100.

Figure 10:
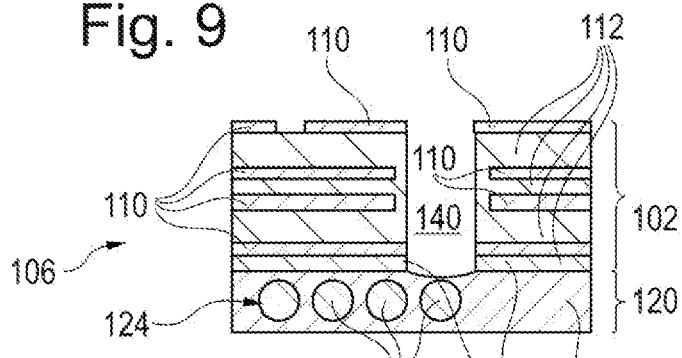
FIG. 10, FIG. 11, FIG. 12, FIG. 13 and FIG. 14 illustrate cross-sectional views of details of structures obtained during carrying out a method of manufacturing an electronic device according to an exemplary embodiment of the invention.

Referring to FIG. 10, the metal body 130 with the integrally formed fluid guiding structures 132 is already connected with the component carrier 102. Moreover, a through hole is drilled (as fluid conduit 140) through the stack 106 so as to obtain an external access to the metal body 130. Formation of the through hole may be done for example by mechanically drilling or laser drilling.

Figure 11:
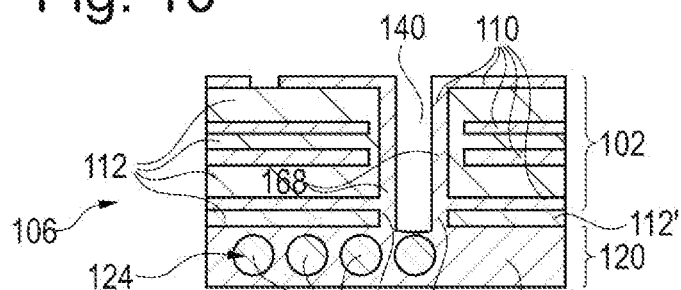

Referring to FIG. 11, sidewalls of the fluid conduit 140 may be coated with electrically conductive material 168 such as copper. For example, this may be accomplished by electroless plating. As a result, the entire fluid conduit 140 is delimited by electrically conductive material rather than by dielectric material of the electrically insulating layer structures 112, 112', which advantageously suppresses undesired soaking of cooling fluid 142 supplied via fluid conduit 140 into fluid guiding structures 132.

Figure 12:
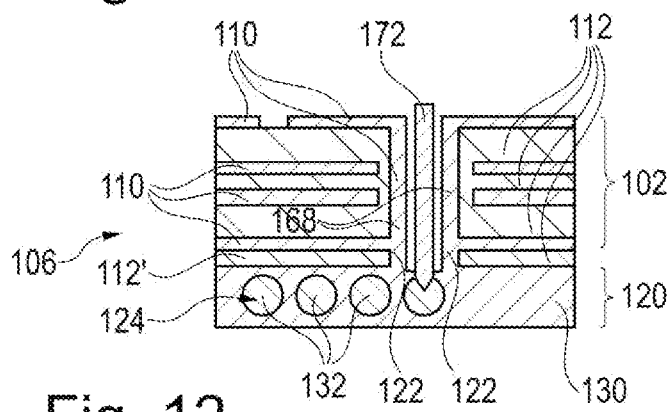
Figure 13:
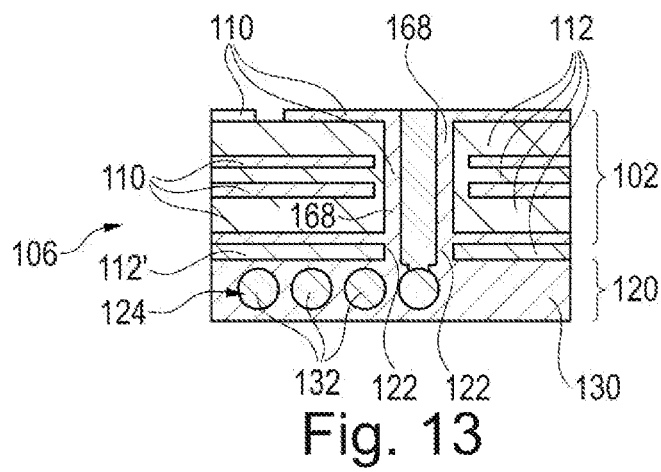

In order to obtain the structure shown in FIG. 12, a drill or pin 172 is inserted in the copper lined fluid conduit 140 until it protrudes through an upper portion of the metal body 130 into the fluid channel 132 beneath for establishing a fluid communication between the fluid conduit 140 and the fluid channel 132. This process is advantageous to keep the channel dry during manufacturing, the opening may be formed at the end of production. In other words, the fluidic connection may be established by removing metal material on the top side of the metal body 130 after connection with the component carrier 102 to thereby establish a fluid communication between an exterior of the electronic device 100 through the component carrier 102 up to the fluid cooling unit 124 of the cooling member 120. The result is shown in FIG. 13.

Figure 14:
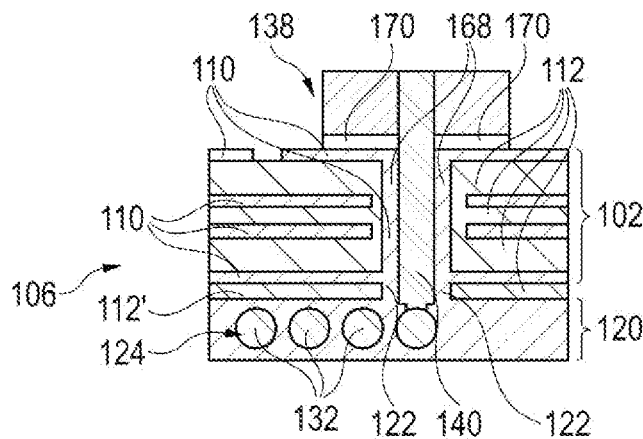

Referring to FIG. 14, fluid interface member 138 is then connected by soldering on the exterior main surface of the component carrier 102 using solder material 170. For instance, fluid interface member 138 may be configured as fitting or fitting part configured for establishing a screw connection with a counter screw (for instance a screw nut) at the end of a supply tube or capillary (not shown). As a result, the electronic device 100 is provided with the fluid interface member 138 connected to fluid conduit 140 for supplying cooling fluid 142 to the fluid channels 132 or for draining cooling fluid 142 from the fluid channels 132. As shown, the fluid interface member 138 is formed at an exterior surface of the component carrier 102 and enables fluid communication through the component carrier 102 into the cooling member 120. Although not shown, it is also possible that fluid interface member 138 is formed at an exterior surface of the cooling member 120. While the fluid interface member 138 is formed at an upper main surface the component carrier 102 according to FIG. 14, it is alternatively possible that the fluid interface member 138 is formed at a sidewall of the component carrier 102 or of the cooling member 120.

Figure 15:
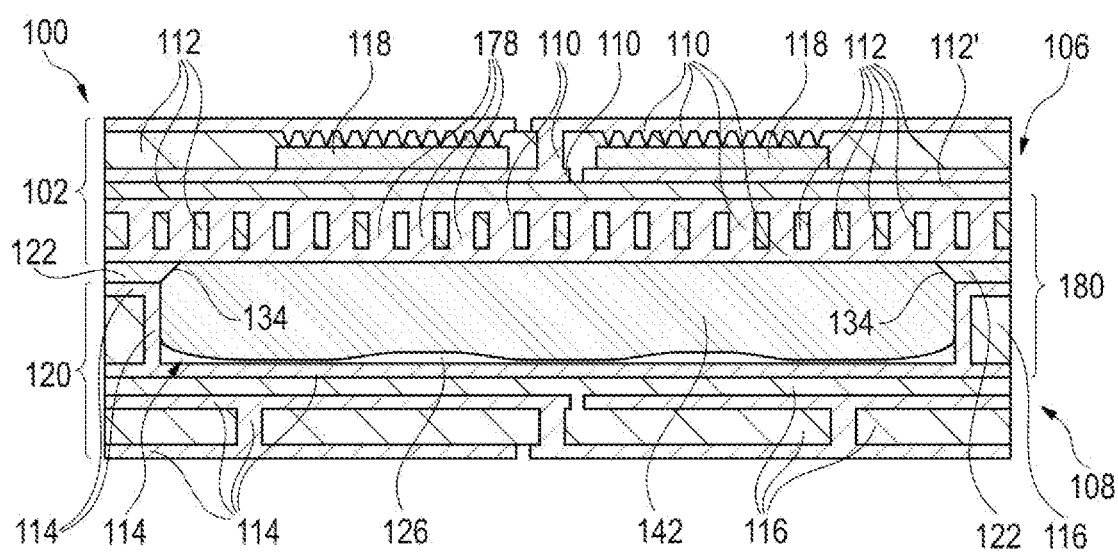
FIG. 15 illustrates a cross-sectional view of an electronic device according to another exemplary embodiment of the invention.

FIG. 15 illustrates a cross-sectional view of an electronic device 100 according to another exemplary embodiment of the invention.

The embodiment of FIG. 15 differs from the embodiment of FIG. 1 in particular in that, according to FIG. 15, the further stack 108 comprises additional further electrically conductive layer structures 114 and further electrically insulating layer structures 116 beneath the cavity 126. Thus, a further build-up is possible at a bottom side of the electronic device 100.

A further difference is that, according to FIG. 15, the metallic connection structure 122 has a slanted surface portion 134 where delimiting cavity 126. This enhances the thermal coupling and thus improves the thermal performance of the electronic device 100.

Moreover, the thickest lowermost electrically conductive layer structure 110 of FIG. 1 is substituted in FIG. 15 by an array of copper pillars 178 extending through an electrically insulating layer structure 112 for establishing a proper thermal contact in a vertical direction of the electronic device 100. The array of copper pillars 178 extending through the electrically insulating layer structure 112 may be embodied as core. Alternatively, a thick copper sheet may be implemented, as in FIG. 1. A cooling structure of the electronic device 100 is denoted in FIG. 15 with reference sign 180.

Figure 16:
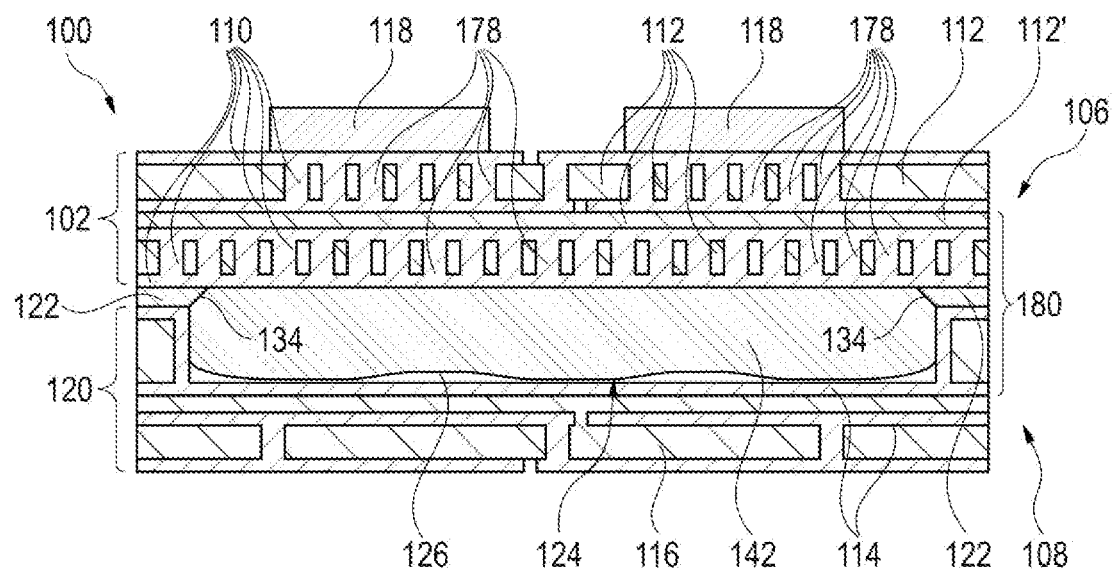
FIG. 16 illustrates a cross-sectional view of an electronic device according to still another exemplary embodiment of the invention.

FIG. 16 illustrates a cross-sectional view of an electronic device 100 according to still another exemplary embodiment of the invention.

The embodiment of FIG. 16 differs from the embodiment of FIG. 15 in particular in that, according to FIG. 16, the electronic components 118 are surface mounted on the laminated layer stack 106 rather than embedded in the laminated layer stack 106. Furthermore, a thermally conductive connection between the surface mounted electronic components 118 and a cooling structure 180 in an interface region between component carrier 102 and cooling member 120 is formed by copper pillars 178 which thermally couple the electronic components 118 with the thermally conductive electrically insulating layer structure 112', for instance embodied as thermal prepreg. At its bottom side, the thermally conductive electrically insulating layer structure 112' is thermally coupled with further copper pillars 178 below, as described referring to FIG. 15.

The upper portion of the component carrier 102 according to FIG. 6 may be embodied as a core with metallized cavity 126.

Figure 17:
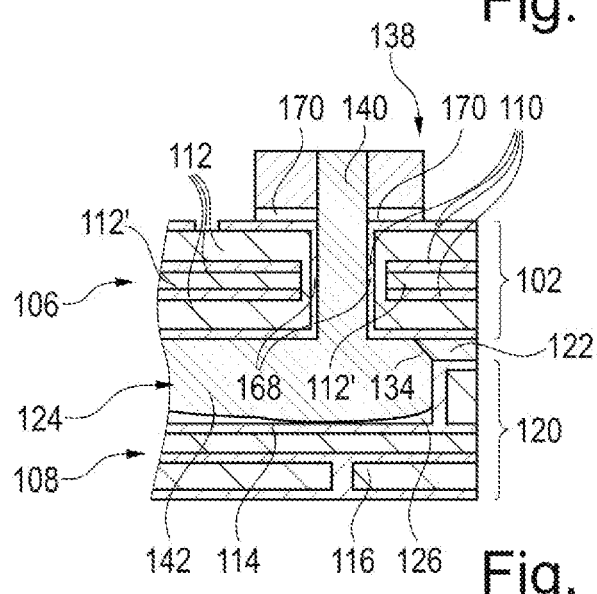
FIG. 17 and FIG. 18 illustrate cross-sectional views of details of structures obtained during carrying out a method of manufacturing an electronic device according to exemplary embodiments of the invention.

FIG. 17 illustrates a cross-sectional view of a detail of structures obtained during carrying out a method of manufacturing an electronic device 100 according to an exemplary embodiment of the invention. As described above, fluid interface member 138 may be a soldered connector to a flexible cooling pipe. Thermally conductive and electrically insulating layer structure 112', which may be a thermally enhanced prepreg, may have a higher thermal conductivity than the other electrically insulating layer structures 112 and may electrically decouple the electric path of the one or more electronic components 118 (not shown in FIG. 17) above from the fluidic path below. At the same time, thermally conductive and electrically insulating layer structure 112' enhances the thermal coupling between the component carrier 102 and the cooling member 120.

The metallic connection structure 122 with the slanted surface portion 134 delimiting the cavity 126 for enhancing thermal coupling between cooling fluid 142 and the electronic component(s) 118 may be formed by establishing a solder connection or a sinter copper connection with properly adjusted process parameters. Together with the copper cladding delimiting the fluid guiding structure related to cavity 126, the slanted surface portion 134 of the metallic connection structure 122 contributes to the thermal performance of the electronic device 100.

Also, a low flow prepreg may be used for enhancing the connection between the component carrier 102 and the cooling member 120.

Figure 18:
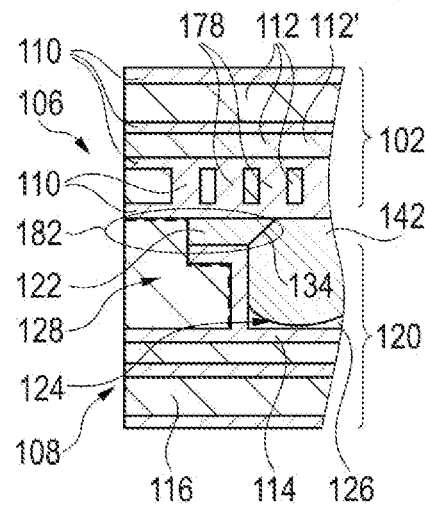

FIG. 18 illustrates a cross-sectional view of a detail of structures obtained during carrying out a method of manufacturing an electronic device 100 according to an exemplary embodiment of the invention.

As indicated by reference sign 182, a lateral end of the metallic connection structure 122 facing away from its slanted surface portion 134 and the further electrically conductive layer structure 114 directly below the metallic connection structure 122 abut laterally to one or more of the further electrically insulating layer structure 116. This abutment creates a stepped metal-resin interface 128, which is also indicated by a dashed line in FIG. 18. Said stepped interface 128 increases the mechanical connection strength in a region between component carrier 102 and cooling member 120.

FIG. 18 shows a vertical interconnect (also denoted as z-interconnect) between component carrier 102 and cooling member 120. In an embodiment, said z-interconnect may be only applied to the edge of the fluid guiding structure, and all the other areas may be filled by a pre-cut prepreg.

Figure 19:
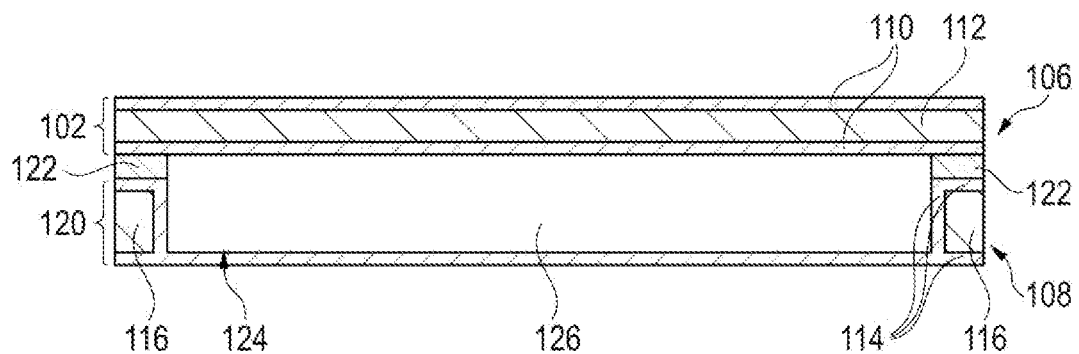
FIG. 19 and FIG. 20 illustrate cross-sectional views of structures obtained during carrying out a method of manufacturing an electronic device according to exemplary embodiments of the invention.
Figure 20:
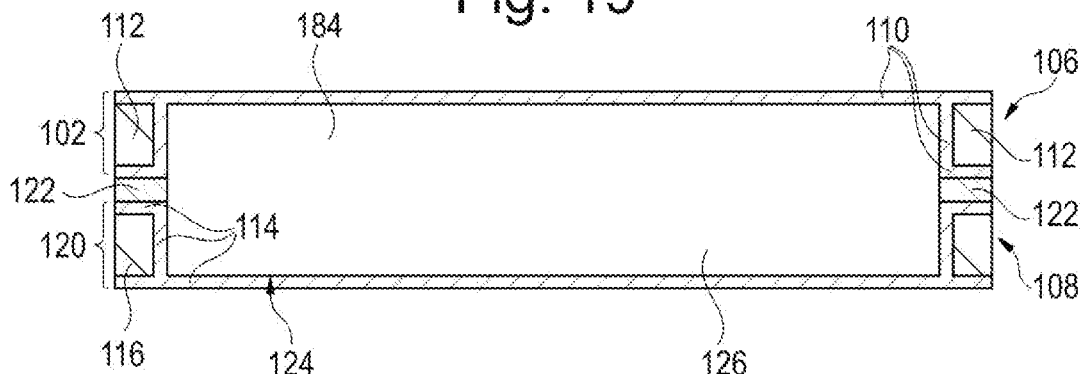

FIG. 19 and FIG. 20 illustrate cross-sectional views of structures obtained during carrying out methods of manufacturing electronic devices 100 according to exemplary embodiments of the invention.

FIG. 19 shows an embodiment in which the fluid accommodating volume for accommodating cooling fluid 142 is defined exclusively by the cavity 126 of the cooling member 120, whereas a flat bottom surface of the component carrier 102 only closes said cavity 126 from an upper side.

FIG. 20 shows another embodiment in which the fluid accommodating volume for accommodating cooling fluid 142 is defined by the cavity 126 of the cooling member 120 and by a recess 184 formed in the bottom surface of the component carrier 102 which closes said cavity 126 from an upper side and increases the fluid accommodation volume. Hence, the cooling performance of the electronic device 100 can be further improved by forming a recess 184 in the bottom surface of the component carrier 102 aligned with the cavity 126 of the cooling member 120.

Figure 21:
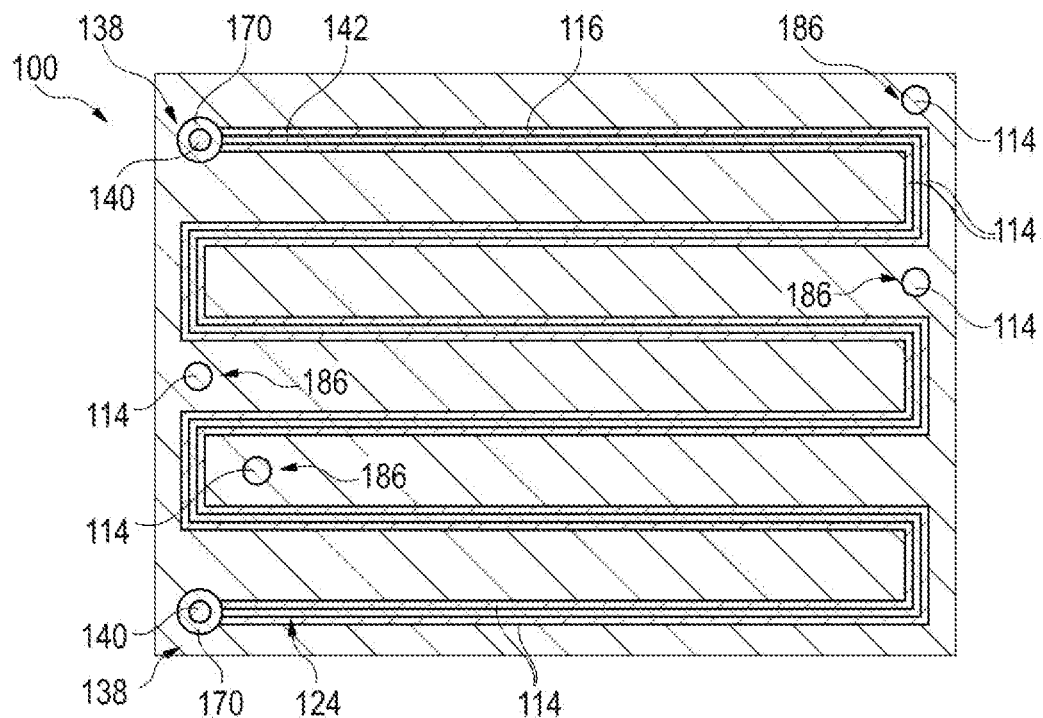
FIG. 21 illustrates a plan view of an electronic device according to yet another exemplary embodiment of the invention.

FIG. 21 illustrates a (partially transparent) plan view of an electronic device 100 according to yet another exemplary embodiment of the invention.

FIG. 21 shows a meandric fluid guiding structure of fluid cooling unit 124 extending between two fluid interface members 138 for creating a continuous flow of cooling fluid 142. The fluid guiding structure may be delimited by the further electrically conductive layer structures 114 and may accommodate cooling fluid 142. For instance, vertically extending electrically conductive connection elements 186 may be embedded in further electrically insulating layer structures 116 and may thereby be reliably electrically and fluidically decoupled from the flow path of the cooling fluid 142.

FIG. 22 to FIG. 26 illustrate cross-sectional views of details of structures obtained during carrying out methods of manufacturing electronic devices 100 according to exemplary embodiments of the invention. For the following description, reference is made to the above description referring to FIG. 10 to FIG. 14, and only differences will be mentioned.

Figure 22:
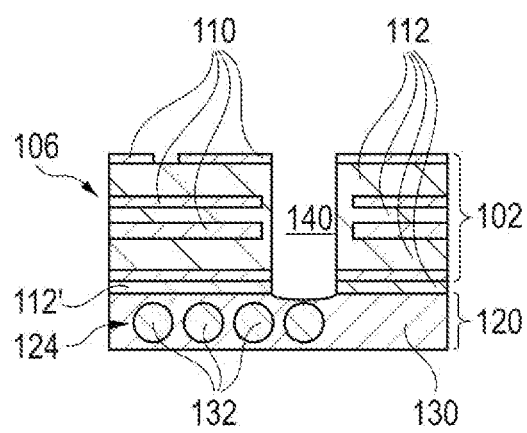
FIG. 22, FIG. 23, FIG. 24, FIG. 25 and FIG. 26 illustrate cross-sectional views of details of structures obtained during carrying out methods of manufacturing electronic devices according to exemplary embodiments of the invention.

Referring to FIG. 22, starting point is a structure according to FIG. 10.

Figure 23:
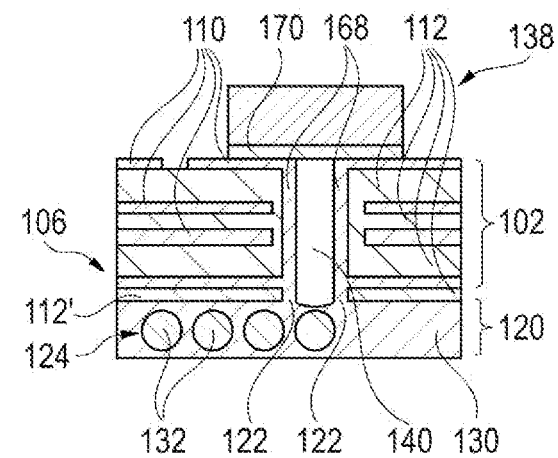

Referring to FIG. 23, sidewalls of fluid conduit 140 may be coated with electrically conductive material 168, and a preform of fluid interface member 138 may be solder-connected to the top of the component carrier 102.

Figure 24:
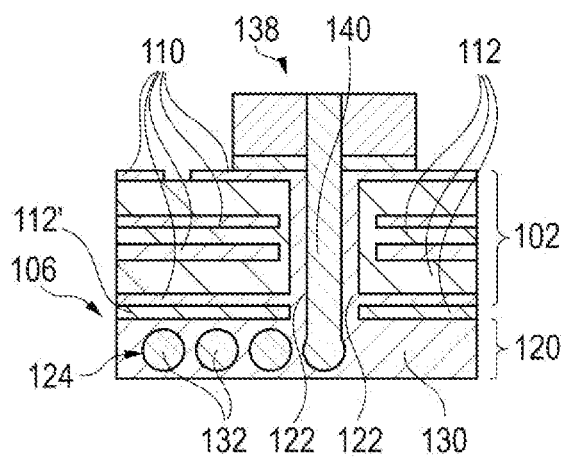

Referring to FIG. 24, an access hole may be formed (for instance by drilling) in the preform of the fluid interface member 138 for establishing a fluid connection with the fluid conduit 140. During forming the access hole, it may be possible to remove metallic material on the top of metal body 130 for fluidically connecting the fluid conduit 140 with the fluid guiding structures 132.

Figure 25:
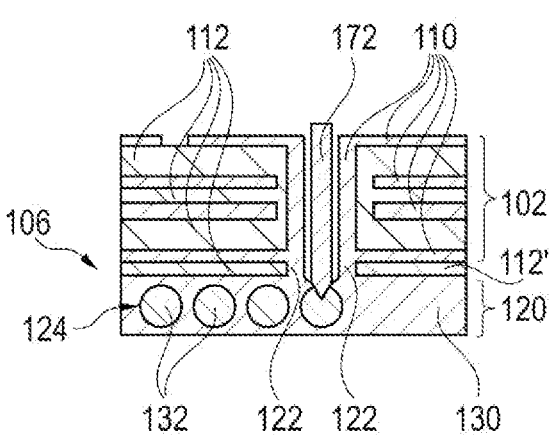

In the alternative of FIG. 25, a drill or pin 172 may be used prior to the connection of the fluid interface member 138 for removing metallic material on the top of metal body 134 for fluidically connecting the fluid conduit 140 with the fluid guiding structures 132 (compare FIG. 12).

Figure 26:
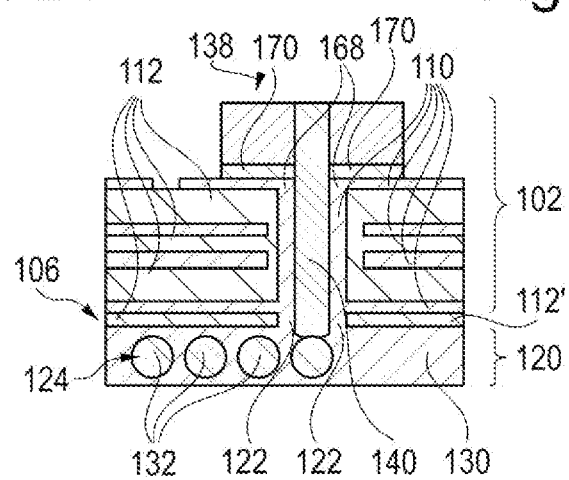

As shown in FIG. 26, fluid interface member 138 may be soldered on top of the structure obtained according to FIG. 25 (compare FIG. 14).

Figure 27:
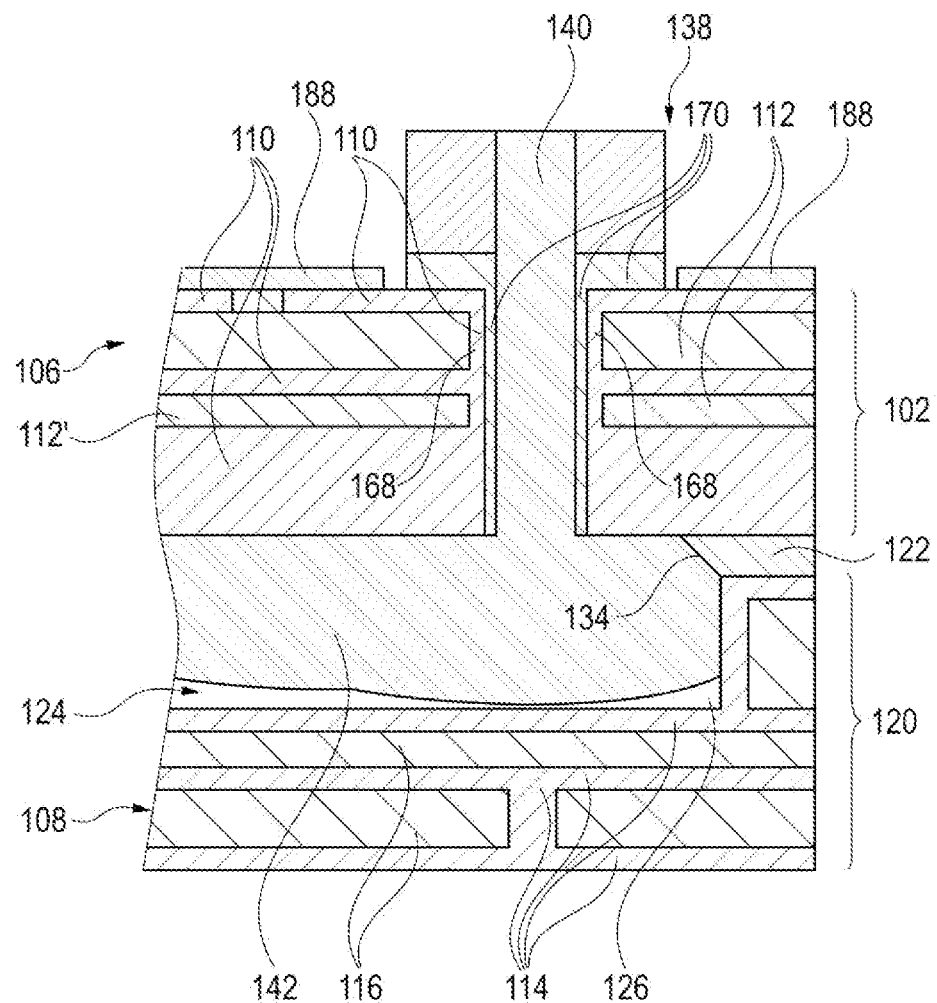
FIG. 27 illustrates a cross-sectional view of a detail of a structure obtained during carrying out a method of manufacturing an electronic device according to an exemplary embodiment of the invention.

FIG. 27 illustrates a cross-sectional view of a detail of a structure obtained during carrying out a method of manufacturing an electronic device 100 according to an exemplary embodiment of the invention.

In addition to the provisions taken according to FIG. 17, a solder resist 188 may be selectively applied to surface portions of the electronic device 100 onto which no solder material 170 should flow.

Figure 28:
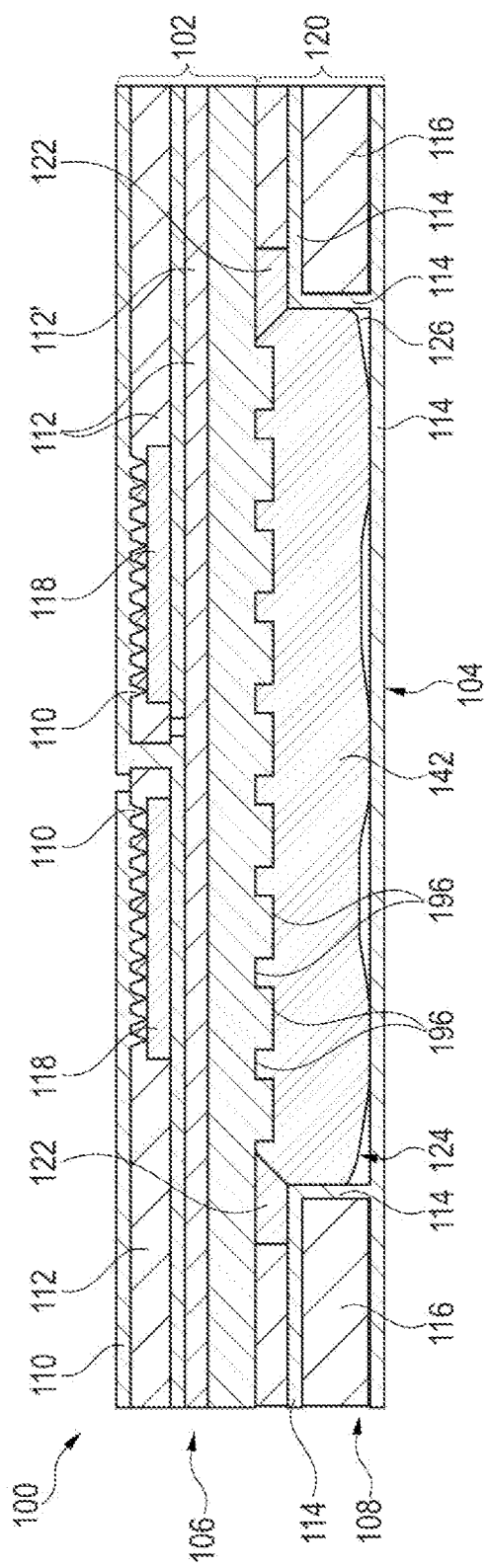
FIG. 28 illustrates a cross-sectional view of an electronic device according to still another exemplary embodiment of the invention with a single-sided inner surface profile as thermally enhancing surface.

FIG. 28 illustrates a cross-sectional view of an electronic device 100 according to still another exemplary embodiment of the invention with an inner surface profile 196 as thermally enhancing surface. As shown, the hollow space 126 is delimited by a thermally conductive wall, wherein an upper main surface of said wall has an inner surface profile 196 with a periodic rectangular pattern. The latter is configured for increasing a thermal exchange area between the cooling fluid 142 and the thermally conductive wall. Consequently, heat removal from the embedded electronic components 118 may be further enhanced.

Figure 29:
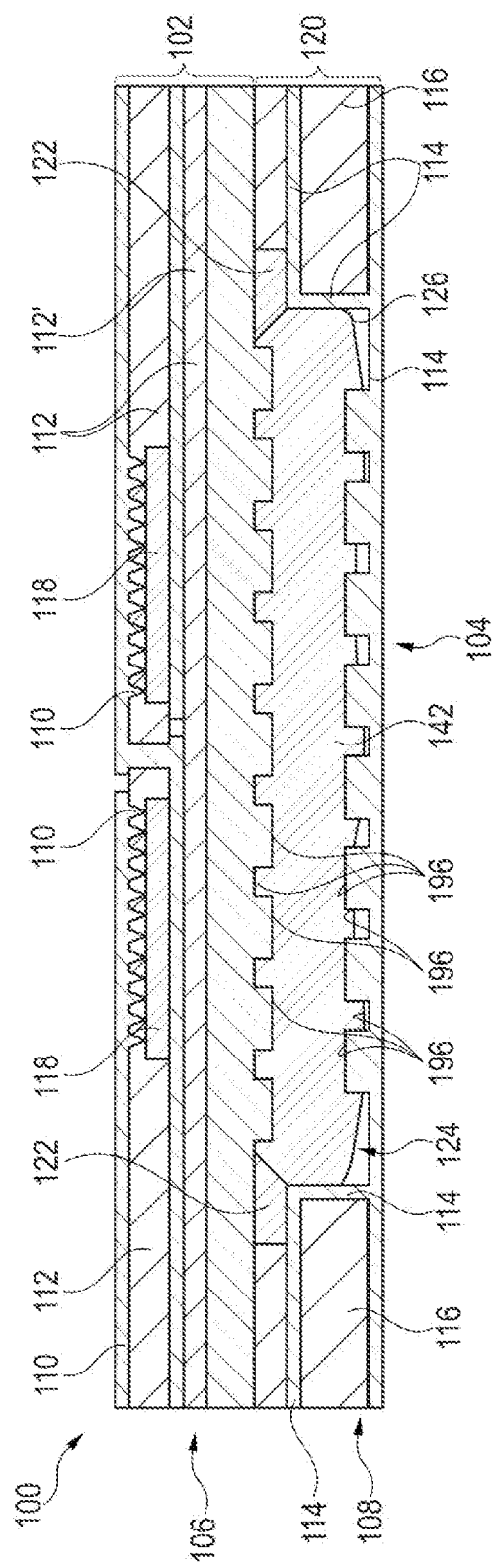
FIG. 29 illustrates a cross-sectional view of an electronic device according to yet another exemplary embodiment of the invention with a two-sided inner surface profile as thermally enhancing surface.

FIG. 29 illustrates a cross-sectional view of an electronic device 100 according to yet another exemplary embodiment of the invention also with an inner surface profile 196 as thermally enhancing surface. The embodiment of FIG. 29 differs from the embodiment of FIG. 28 in that, according to FIG. 29, both an upper main surface and a lower main surface of said wall have an inner surface profile 196 with a periodic rectangular pattern. As a result, an even stronger enhanced thermal coupling between component carrier 102 and cooling member 120 may be obtained.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. An electronic device, comprising:
    a component carrier comprising a stack with at least one electrically conductive layer structure and/or at least one electrically insulating layer structure;
    an electronic component on and/or in the stack; and
    a cooling member with a fluid cooling unit at least partially therein;
    wherein the component carrier and the cooling member are connected by a connection structure,
    wherein the cooling member comprises a further component carrier which comprises a further stack comprising at least one further electrically conductive layer structure and/or at least one further electrically insulating layer structure.

2. The electronic device according to claim 1, wherein the fluid cooling unit comprises a hollow space for accommodating cooling fluid, being at least partially filled with cooling fluid, the hollow space delimited by an at least partially thermally conductive wall at least part of which having an inner surface profile configured for increasing a thermal exchange area between cooling fluid and the at least partially thermally conductive wall.

3. The electronic device according to claim 1, wherein the connection structure comprises at least one of the group consisting of a solder structure, a sinter structure, and an electrically conductive glue.

4. The electronic device according to claim 1, wherein the fluid cooling unit is at least partially delimited by a cavity in the further stack.

5. The electronic device according to claim 1, wherein the connection structure and at least one of the at least one further electrically conductive layer structure partially delimit a cooling fluid accommodating cavity of the cooling unit, wherein said connection structure and said at least one of the at least one further electrically conductive layer structure abut to at least one of the at least one further electrically insulating layer structure with a stepped interface.

6. The electronic device according to claim 1, wherein the cooling member comprises a metal body with at least one integrally formed fluid guiding structure.

7. The electronic device according to claim 1, comprising at least one of the following features:
    wherein the connection structure is connected to at least one of the at least one electrically conductive layer structure of the component carrier;
    wherein the connection structure is electrically decoupled from the electronic component by at least one of the at least one electrically insulating layer structure of the component carrier;
    wherein the connection structure partially delimits a cooling fluid accommodating cavity of the fluid cooling unit, wherein the connection structure has a slanted surface portion which partially delimits the cooling fluid accommodating cavity;
    wherein at least one of said at least one electrically insulating layer structure has a thermal conductivity of at least 1.4 W/mK is a thermal prepreg and/or comprises ceramic material such as aluminum oxide;
    wherein a fluid guiding structure of the cooling member is fully circumferentially delimited by electrically conductive material.

8. The electronic device according to claim 1, further comprising:
    at least one fluid interface member configured for being connected to a fluid conduit in the component carrier and/or in the cooling member for supplying cooling fluid to the fluid cooling unit and/or for draining cooling fluid from the fluid cooling unit.

9. The electronic device according to claim 8, comprising at least one of the following features:
wherein the at least one fluid interface member is configured for establishing a screw connection with an external tubing;
wherein the at least one fluid interface member is formed at an exterior surface of the component carrier and/or is formed at an exterior surface of the cooling member;
wherein the at least one fluid interface member is formed at a main surface and/or is formed at a sidewall of the electronic device.

10. The electronic device according to claim 1, comprising at least one of the following features:
wherein one electrically insulating layer structure of the at least one electrically insulating layer structure being located closest to the connection structure has a higher value of the thermal conductivity than all other of the at least one electrically insulating layer structure;
wherein the fluid cooling unit is integrated within the cooling member, or is formed in the cooling member and closed by the component carrier;
wherein the cooling member comprises at least one fluid guiding structure configured to at least partially thermally conductive wall create swirl.

11. The electronic device according to claim 1, wherein the connection structure comprises thermal interface material which contributes to a heat removal from the electronic component to the cooling unit.

12. The electronic device according to claim 11, wherein the thermal interface material is thermally conductive and electronically non-conductive.

13. The electronic device according to claim 1, wherein the connection structure is an annular structure.

14. The electronic device according to claim 1, wherein the connection structure comprises metal and forms a metallic connection structure.

15. A method of manufacturing an electronic device, the method comprising:
mounting an electronic component on and/or in a stack of a component carrier, the stack comprising at least one electrically conductive layer structure and/or at least one electrically insulating layer structure;
forming at least part of a fluid cooling unit in a cooling member; and
connecting the component carrier and the cooling member by a connection structure,
wherein the cooling member comprises a further component carrier which comprises a further stack comprising at least one further electrically conductive layer structure and/or at least one further electrically insulating layer structure.

16. The method according to claim 15, wherein the method comprises connecting the component carrier and the cooling member by a metallic connection structure.

17. The method according to claim 15, wherein the method comprises connecting the component carrier and the cooling member by a connection structure which contributes to a heat removal from the electronic component to the fluid cooling unit.

18. The method according to claim 15, wherein the method comprises forming the fluid cooling unit:
as a cavity in a further component carrier which comprises a further stack comprising at least one further electrically conductive layer structure and/or at least one further electrically insulating layer structure; and
by embedding a poorly adhesive structure in the further stack and circumferentially cutting out a piece of the stack which is delimited at a bottom side by the poorly adhesive structure.

19. The method according to claim 15, wherein the method comprises forming the fluid cooling unit:
as at least one fluid guiding structure integrally formed in a metal body; and
by removing metal material of the metal body after connection with the component carrier to thereby establish a fluid communication from an exterior of the electronic device through the component carrier up to the at least one fluid guiding structure.

20. An electronic device, comprising:
a component carrier comprising a stack with at least one electrically conductive layer structure and/or at least one electrically insulating layer structure;
an electronic component on and/or in the stack; and
a cooling member with a fluid cooling unit at least partially therein;
wherein the component carrier and the cooling member are connected by a connection structure,
wherein the fluid cooling unit is formed in the cooling member and closed by the component carrier.

* * * * *